United States Patent
Tuncer

(10) Patent No.: US 11,342,251 B2
(45) Date of Patent: May 24, 2022

(54) ISOLATED COMPONENT DESIGN

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/015,059

(22) Filed: Sep. 8, 2020

(65) Prior Publication Data

US 2020/0402896 A1 Dec. 24, 2020

Related U.S. Application Data

(63) Continuation of application No. 16/401,828, filed on May 2, 2019, now Pat. No. 10,770,378.

(51) Int. Cl.
*H01L 23/495* (2006.01)

(52) U.S. Cl.
CPC .. *H01L 23/49558* (2013.01); *H01L 23/49562* (2013.01)

(58) Field of Classification Search
None
See application file for complete search history.

(56) References Cited

U.S. PATENT DOCUMENTS

| 5,517,060 | A | 5/1996 | Kobayashi |
| 6,150,721 | A | 11/2000 | Bandyopadhyay et al. |
| 7,008,825 | B1 * | 3/2006 | Bancod ............. G01R 31/2896 257/666 |
| 8,304,277 | B2 * | 11/2012 | Pagaila ................. H01L 21/561 438/55 |
| 2002/0000579 | A1 | 1/2002 | Aoyama |
| 2010/0295161 | A1 | 11/2010 | Koduri |

* cited by examiner

*Primary Examiner* — Hung K Vu
(74) *Attorney, Agent, or Firm* — Dawn Jos; Charles A. Brill; Frank D. Cimino

(57) ABSTRACT

A microelectronic device includes a first conductor and a second conductor, separated by a lateral spacing. The first conductor has a low field contour facing the second conductor. The low field contour has offsets from a tangent line to the first conductor on the low field contour. Each of the offsets increases a separation of the high voltage conductor from the low voltage conductor. A first offset, located from an end of the high voltage conductor, at a first lateral distance of 25 percent of the minimum separation, is 19 percent to 28 percent of the minimum separation. A second offset, located at a second lateral distance of 50 percent of the minimum separation, is 9 percent to 14 percent of the minimum separation. A third offset, located at a third lateral distance of 75 percent of the minimum separation, is 4 percent to 6 percent of the minimum separation.

19 Claims, 4 Drawing Sheets

ISOLATED COMPONENT DESIGN

This application is a continuation of U.S. patent application Ser. No. 16/401,828, filed May 2, 2019, the contents of which are herein incorporated by reference in its entirety.

FIELD

This disclosure relates to the field of microelectronic devices. More particularly, this disclosure relates to isolated components in microelectronic devices.

BACKGROUND

Some microelectronic devices have high voltage conductors, such as die attach pads or interconnect electrodes, which may be operated at high voltage with respect to other components in the microelectronic devices. High electric fields may be generated at corners of the high voltage conductors, which may cause unwanted leakage currents or dielectric breakdown, leading to degradation or failure of the microelectronic devices. The corners of the high voltage conductors may be rounded, resulting in loss of usable area of the high voltage conductors. Attaining a contour of the high voltage conductors which reduces excess electric fields and maximizes usable area is desired.

SUMMARY

The present disclosure introduces a microelectronic device including a first conductor with a low field contour having offsets based on a lateral separation from a second conductor. Each of the offsets increases a separation of the first conductor from the second conductor. A first offset, located from an end of the first conductor, at a first lateral distance of 25 percent of the lateral separation, is 19 percent to 28 percent of the lateral separation. A second offset, located from the end of the first conductor, at a second lateral distance of 50 percent of the lateral separation, is 9 percent to 14 percent of the lateral separation. A third offset, located from the end of the first conductor, at a third lateral distance of 75 percent of the lateral separation, is 4 percent to 6 percent of the lateral separation.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

Figure 1A:
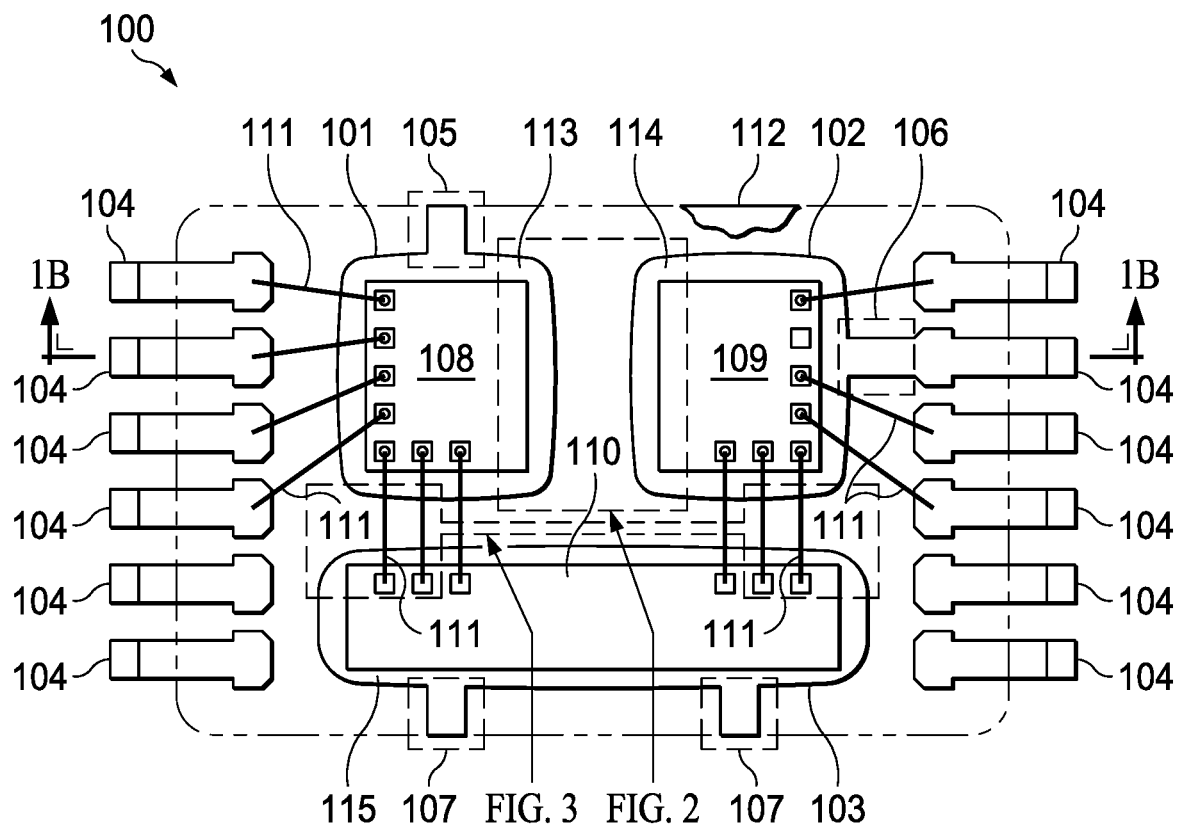
FIG. 1A is a top view and FIG. 1B is a cross section of an example microelectronic device having a high voltage conductor with a low field contour.
Figure 1B:
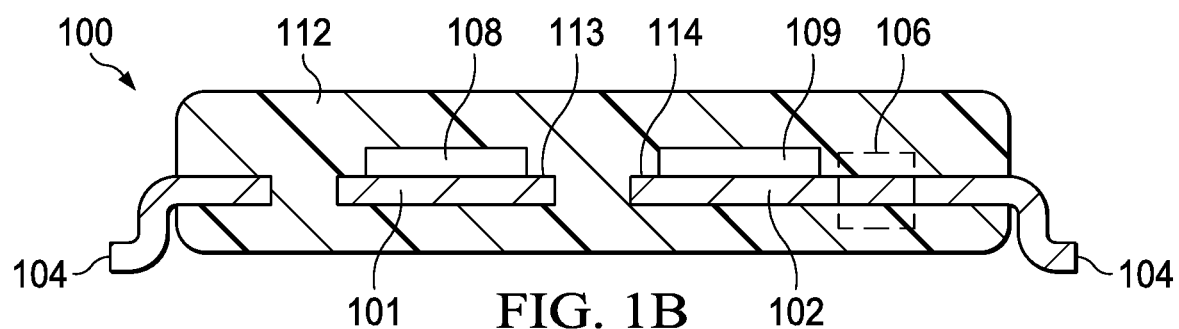

FIG. 1A is a top view and FIG. 1B is a cross section of an example microelectronic device having a high voltage conductor with a low field contour. Referring to FIG. 1A, the microelectronic device 100 of this example is manifested as a packaged device 100. The microelectronic device 100 includes a high voltage conductor 101, which is manifested as a high voltage die pad 101 in this example. The microelectronic device 100 also includes a first low voltage conductor 102, which is manifested as a first low voltage die attach pad 102 in this example. The microelectronic device 100 of this example further includes a second low voltage conductor 103, which is manifested as a second low voltage die attach pad 103.

Figure 2:
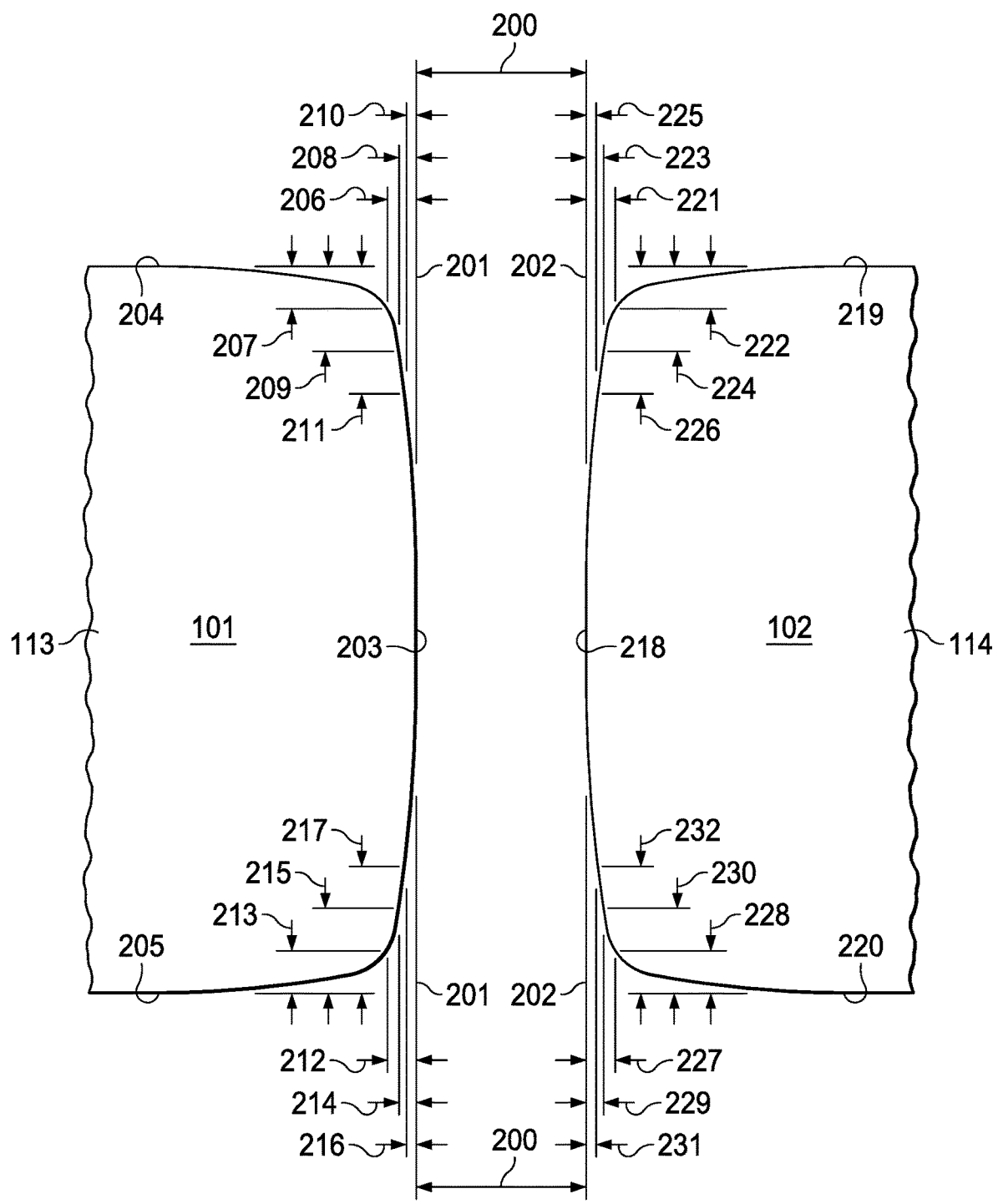
FIG. 2 is a top view of portions of the high voltage conductor and the first low voltage conductor.
Figure 3:
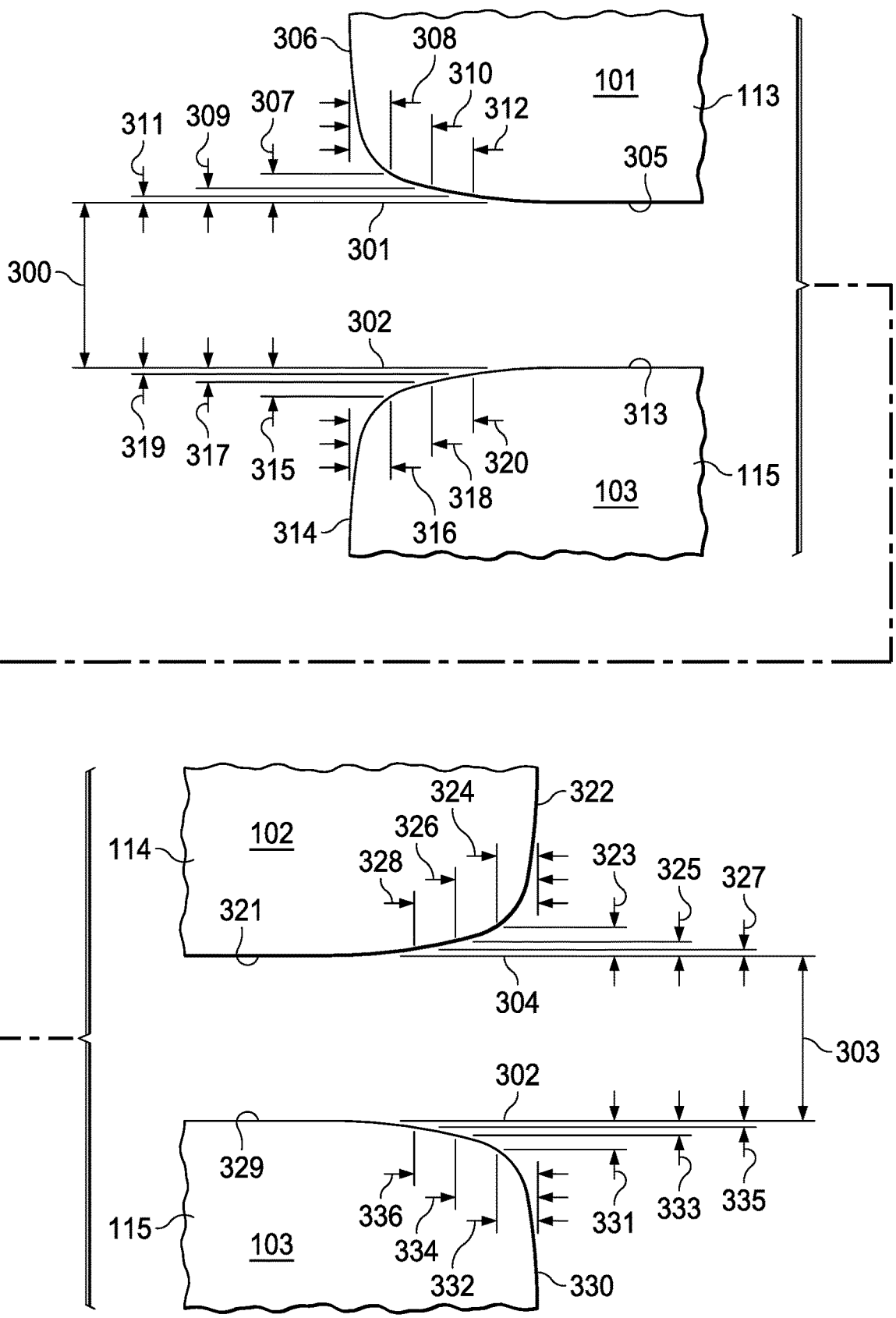
FIG. 3 is a top view of portions of the high voltage conductor, the first low voltage conductor, and the second low voltage conductor.

The high voltage conductor 101 has a first low field contour, which is described in more detail in reference to FIG. 2 and FIG. 3. The first low voltage conductor 102 has a second low field contour, which is described in more detail in reference to FIG. 2. The second low voltage conductor 103 has a third low field contour, which is described in more detail in reference to FIG. 3. The high voltage conductor 101, the first low voltage conductor 102, and the second low voltage conductor 103 may include, for example, copper or stainless steel, and may have plated layers of nickel, gold, or other metals on exterior surfaces.

The microelectronic device 100 of this example includes leads 104 which provide external terminals for the microelectronic device 100. The high voltage conductor 101, the first low voltage conductor 102, the second low voltage conductor 103, and the leads 104 may be parts of a lead frame, not shown in FIG. 1A.

The high voltage conductor 101 may be electrically isolated from the leads 104, the first low voltage conductor 102, and the second low voltage conductor 103. The high voltage conductor 101 may include a first tie bar 105 which attached the high voltage conductor 101 to the lead frame during fabrication of the microelectronic device 100. Alternatively, the high voltage conductor 101 may be electrically connected to one or more of the leads 104 by a tie bar, not shown in FIG. 1A.

The first low voltage conductor 102 may be electrically connected to one or more of the leads 104 by a second tie bar 106. The second tie bar 106 may be part of the lead frame. Alternatively, the first low voltage conductor 102 may be electrically isolated from the leads 104.

The second low voltage conductor 103 may be electrically isolated from the leads 104, the high voltage conductor 101, and the first low voltage conductor 102. The second low voltage conductor 103 may include third tie bars 107 which attached the second low voltage conductor 103 to the lead frame during fabrication of the microelectronic device 100. Alternatively, the second low voltage conductor 103 may be electrically connected to one or more of the leads 104 by a tie bar, not shown in FIG. 1A.

The high voltage conductor 101 has a first surface 113. The microelectronic device 100 of this example includes a first die 108 attached to the first surface 113 of the high voltage conductor 101. The first die 108 may be manifested as an integrated circuit, a discrete semiconductor device, an electro-optical device, a microelectrical mechanical system (MEMS) device, or a microfluidics device, for example. The first die 108 may be attached to the high voltage conductor 101 by solder, an adhesive, or other die attach material.

The first low voltage conductor 102 has a second surface 114. The second surface 114 is parallel to the first surface 113 of the high voltage conductor 101, and furthermore, the second surface 114 may be coplanar with the first surface 113. The microelectronic device 100 of this example includes a second die 109 attached to the second surface 114 of the first low voltage conductor 102. The second die 109 may be manifested as the same device type as the first die 108, or may be manifested as a different device type. The second die 109 may be attached to the first low voltage conductor 102 by solder, an adhesive, or other die attach material.

The second low voltage conductor 103 has a third surface 115. The third surface 115 is parallel to the first surface 113 of the high voltage conductor 101, and furthermore, the third surface 115 may be coplanar with the first surface 113. The microelectronic device 100 of this example includes a third die 110 attached to the third surface 115 of the second low voltage conductor 103. The third die 110 may be manifested as a coupling device, for example, such as a transformer or capacitor. The third die 110 may be attached to the second low voltage conductor 103 by any die attach material.

The first die 108 may be electrically connected to one or more of the leads 104, and to the third die 110, by wire bonds 111. Similarly, the second die 109 may be electrically connected to one or more of the leads 104, and to the third die 110, by the wire bonds 111.

The microelectronic device 100 of this example includes a package structure 112 around the high voltage conductor 101, the first low voltage conductor 102, the second low voltage conductor 103, first die 108, the second die 109, the third die 110, and the wire bonds 111, and contacting the leads 104. The package structure 112 may include a dielectric material, such as epoxy, or may include a ceramic carrier. The first tie bar 105 and the third tie bars 107 may extend to a surface of the package structure 112, as depicted in FIG. 1A.

Referring to FIG. 1B, the leads 104 extend from the package structure 112 to provide external terminals for the microelectronic device 100. In this example, the leads 104 have a gull-wing configuration. Alternatively, the leads 104 may have a J-lead configuration, or may have a leadless configuration. Other configurations for the leads 104 are within the scope of this example.

During operation of the microelectronic device 100, the high voltage conductor 101 may be biased to a high voltage, for example, 100 volts or more, with respect to the first low voltage conductor 102. A baseline electric field between the high voltage conductor 101 and the first low voltage conductor 102 extends directly between the high voltage conductor 101 and the first low voltage conductor 102, and has a value of a potential difference between the high voltage conductor 101 and the first low voltage conductor 102 divided by a minimum distance between the high voltage conductor 101 and the first low voltage conductor 102. The first low field contour on the high voltage conductor 101, and the second low field contour on the first low voltage conductor 102 may limit the electric field around the high voltage conductor 101 to a level less than the baseline electric field, advantageously improving reliability of the microelectronic device 100.

FIG. 2 is a top view of portions of the high voltage conductor 101 and the first low voltage conductor 102. The first die 108 and the second die 109 of FIG. 1A are not shown in FIG. 2, to more clearly show details of the high voltage conductor 101 and the first low voltage conductor 102. The high voltage conductor 101 and the first low voltage conductor 102 are laterally separated by a first lateral separation 200. For the purposes of this disclosure, the terms "lateral" and "laterally" are understood to refer to a direction parallel to the first surface 113. The first lateral separation 200 extends from a first straight tangent line 201 that is tangent to the high voltage conductor 101, to a second straight tangent line 202 that is tangent to the first low voltage conductor 102. The first straight tangent line 201 is parallel to the second straight tangent line 202.

The high voltage conductor 101 has a first low field contour 203 along a side facing the first low voltage conductor 102. The first straight tangent line 201 is tangent to the high voltage conductor 101 on the first low field contour 203. The first low field contour 203 has offsets from the first straight tangent line 201. A first plurality of the offsets are referenced from a first end 204 of the high voltage conductor 101. A second plurality of the offsets are referenced from a second end 205 of the high voltage conductor 101.

Regarding the first plurality of the offsets, a first offset 206 is located at a first lateral distance 207 of 25 percent of the first lateral separation 200 from the first end 204 of the high voltage conductor 101. The first offset 206 is 19 percent to 28 percent of the first lateral separation 200. A second offset 208 is located at a second lateral distance 209 of 50 percent of the first lateral separation 200 from the first end 204 of the high voltage conductor 101. The second offset 208 is 9 percent to 14 percent of the first lateral separation 200. A third offset 210 is located at a third lateral distance 211 of 75 percent of the first lateral separation 200 from the first end 204 of the high voltage conductor 101. The third offset 210 is 4 percent to 6 percent of the first lateral separation 200.

Regarding the second plurality of the offsets, a fourth offset 212 is located at a fourth lateral distance 213 of 25 percent of the first lateral separation 200 from the second end 205 of the high voltage conductor 101. The fourth offset 212 is 19 percent to 28 percent of the first lateral separation 200. A fifth offset 214 is located at a fifth lateral distance 215 of 50 percent of the first lateral separation 200 from the second end 205 of the high voltage conductor 101. The fifth offset 214 is 9 percent to 14 percent of the first lateral separation 200. A sixth offset 216 is located at a sixth lateral distance 217 of 75 percent of the first lateral separation 200 from the second end 205 of the high voltage conductor 101. The sixth offset 216 is 4 percent to 6 percent of the first lateral separation 200.

The first low voltage conductor 102 may have a second low field contour 218 along a side facing the high voltage conductor 101. The second straight tangent line 202 is tangent to the first low voltage conductor 102 on the second low field contour 218. The second low field contour 218 has offsets from the second straight tangent line 202. A first plurality of the offsets are referenced from a first end 219 of the first low voltage conductor 102. A second plurality of the offsets are referenced from a second end 220 of the first low voltage conductor 102.

Regarding the first plurality of the offsets for the second low field contour 218, a first offset 221 is located at a first lateral distance 222 of 25 percent of the first lateral separation 200 from the first end 219 of the first low voltage conductor 102. The first offset 221 is 19 percent to 28 percent of the first lateral separation 200. A second offset 223 is located at a second lateral distance 224 of 50 percent of the first lateral separation 200 from the first end 219 of the first low voltage conductor 102. The second offset 223 is 9 percent to 14 percent of the first lateral separation 200. A third offset 225 is located at a third lateral distance 226 of 75 percent of the first lateral separation 200 from the first end 219 of the first low voltage conductor 102. The third offset 225 is 4 percent to 6 percent of the first lateral separation 200.

Regarding the second plurality of the offsets for the second low field contour 218, a fourth offset 227 is located at a fourth lateral distance 228 of 25 percent of the first lateral separation 200 from the second end 220 of the first low voltage conductor 102. The fourth offset 227 is 19 percent to 28 percent of the first lateral separation 200. A fifth offset 229 is located at a fifth lateral distance 230 of 50 percent of the first lateral separation 200 from the second end 220 of the first low voltage conductor 102. The fifth offset 229 is 9 percent to 14 percent of the first lateral separation 200. A sixth offset 231 is located at a sixth lateral distance 232 of 75 percent of the first lateral separation 200 from the second end 220 of the first low voltage conductor 102. The sixth offset 231 is 4 percent to 6 percent of the first lateral separation 200.

The first end 204 of the high voltage conductor 101 may be aligned with the first end 219 of the first low voltage conductor 102. The second end 205 of the high voltage conductor 101 may be aligned with the second end 220 of the first low voltage conductor 102. Aligning the ends 204 and 205 of the high voltage conductor 101 with the ends 219 and 220 of the first low voltage conductor 102 may enable efficient spatial use of the high voltage conductor 101 and the first low voltage conductor 102 for the attached die 108 and 109 of FIG. 1A.

The first low field contour 203 may advantageously provide a desired tradeoff between a maximum electric field around the high voltage conductor 101 and usable die area on the first surface 113 of the high voltage conductor 101. Similarly, the second low field contour 218 may provide a similar advantage for the first low voltage conductor 102. For example, the first low field contour 203 may advantageously enable the first die 108 of FIG. 1A to extend to within 25 percent of the first lateral separation 200 from the first end 204 of the high voltage conductor 101, the second end 205 of the high voltage conductor 101, and a center of the first low field contour 203 directly opposite from the first low voltage conductor 102, while an electric field around the first low field contour 203 is less than the baseline electric field described in reference to FIG. 1A and FIG. 1B. A similar advantage may accrue to the second die 109 of FIG. 1A.

FIG. 3 is a top view of portions of the high voltage conductor 101, the first low voltage conductor 102, and the second low voltage conductor 103. The first die 108, the second die 109, and the third die 110 of FIG. 1A are not shown in FIG. 3, to more clearly show details of the high voltage conductor 101, the first low voltage conductor 102, and the second low voltage conductor 103. The high voltage conductor 101 and the second low voltage conductor 103 are laterally separated by a second lateral separation 300. The second lateral separation 300 extends from a third straight tangent line 301 that is tangent to the high voltage conductor 101, to a fourth straight tangent line 302 that is tangent to the second low voltage conductor 103. The third straight tangent line 301 is parallel to the fourth straight tangent line 302.

The first low voltage conductor 102 and the second low voltage conductor 103 are laterally separated by a third lateral separation 303. The third lateral separation 303 may be equal to the second lateral separation 300, or may optionally be greater than or less than the second lateral separation 300. The third lateral separation 303 extends from a fifth straight tangent line 304 that is tangent to the first low voltage conductor 102, to the fourth straight tangent line 302 that is tangent to the second low voltage conductor 103. The fifth straight tangent line 304 is parallel to the fourth straight tangent line 302.

The high voltage conductor 101 has a third low field contour 305 along a side facing the second low voltage conductor 103. The third straight tangent line 301 is tangent to the high voltage conductor 101 on the third low field contour 305. The third low field contour 305 has offsets from the third straight tangent line 301. A third plurality of the offsets are referenced from a third end 306 of the high voltage conductor 101. Regarding the third plurality of the offsets in the third low field contour 305, a seventh offset 307 is located at a seventh lateral distance 308 of 25 percent of the second lateral separation 300 from the third end 306 of the high voltage conductor 101. The seventh offset 307 is 19 percent to 28 percent of the second lateral separation 300. An eighth offset 309 is located at an eighth lateral distance 310 of 50 percent of the second lateral separation 300 from the third end 306 of the high voltage conductor 101. The eighth offset 309 is 9 percent to 14 percent of the second lateral separation 300. A ninth offset 311 is located at a ninth lateral distance 312 of 75 percent of the second lateral separation 300 from the third end 306 of the high voltage conductor 101. The ninth offset 311 is 4 percent to 6 percent of the second lateral separation 300.

The second low voltage conductor 103 has a fourth low field contour 313 along a side facing the high voltage conductor 101. The fourth straight tangent line 302 is tangent to the second low voltage conductor 103 on the fourth low field contour 313. The fourth low field contour 313 has offsets from the fourth straight tangent line 302. A first plurality of the offsets are referenced from a first end 314 of the second low voltage conductor 103. Regarding the first plurality of the offsets in the fourth low field contour 313, a first offset 315 is located at a first lateral distance 316 of 25 percent of the second lateral separation 300 from the first end 314 of the second low voltage conductor 103. The first offset 315 is 19 percent to 28 percent of the second lateral separation 300. A second offset 317 is located at a second lateral distance 318 of 50 percent of the second lateral separation 300 from the first end 314 of the second low voltage conductor 103. The second offset 317 is 9 percent to 14 percent of the second lateral separation 300. A third offset 319 is located at a third lateral distance 320 of 75 percent of the second lateral separation 300 from the first end 314 of the second low voltage conductor 103. The third offset 319 is 4 percent to 6 percent of the second lateral separation 300.

The first low voltage conductor 102 has a fifth low field contour 321 along a side facing the second low voltage conductor 103. The fifth straight tangent line 304 is tangent to the first low voltage conductor 102 on the fifth low field contour 321. The fifth low field contour 321 has offsets from the fifth straight tangent line 304. A third plurality of the offsets are referenced from a third end 322 of the first low voltage conductor 102. Regarding the third plurality of the offsets in the fifth low field contour 321, a seventh offset 323 is located at a seventh lateral distance 324 of 25 percent of the third lateral separation 303 from the third end 322 of the first low voltage conductor 102. The seventh offset 323 is 19 percent to 28 percent of the third lateral separation 303. An eighth offset 325 is located at an eighth lateral distance 326 of 50 percent of the third lateral separation 303 from the third end 322 of the first low voltage conductor 102. The eighth offset 325 is 9 percent to 14 percent of the third lateral separation 303. A ninth offset 327 is located at a ninth lateral distance 328 of 75 percent of the third lateral separation 303 from the third end 322 of the first low voltage conductor 102. The ninth offset 327 is 4 percent to 6 percent of the third lateral separation 303.

The second low voltage conductor 103 has a sixth low field contour 329 along a side facing the first low voltage conductor 102. The fourth straight tangent line 302 is tangent to the second low voltage conductor 103 on the sixth low field contour 329. The sixth low field contour 329 has offsets from the fourth straight tangent line 302. A second plurality of the offsets are referenced from a second end 330 of the second low voltage conductor 103. Regarding the second plurality of the offsets in the sixth low field contour 329, a fourth offset 331 is located at a fourth lateral distance 332 of 25 percent of the third lateral separation 303 from the second end 330 of the second low voltage conductor 103. The fourth offset 331 is 19 percent to 28 percent of the third lateral separation 303. A fifth offset 333 is located at a fifth lateral distance 334 of 50 percent of the third lateral separation 303 from the second end 330 of the second low voltage conductor 103. The fifth offset 333 is 9 percent to 14 percent of the third lateral separation 303. A sixth offset 335 is located at a sixth lateral distance 336 of 75 percent of the third lateral separation 303 from the second end 330 of the second low voltage conductor 103. The sixth offset 335 is 4 percent to 6 percent of the third lateral separation 303.

The third end 306 of the high voltage conductor 101 may optionally not be aligned with the first end 314 of the second low voltage conductor 103, as indicated in FIG. 3. Similarly, the third end 322 of the first low voltage conductor 102 may optionally not be aligned with the second end 330 of the second low voltage conductor 103, as indicated in FIG. 3. The third low field contour 305 may provide a similar advantage for the high voltage conductor 101 as that provided by the first low field contour 203 of FIG. 2. The fifth low field contour 321 may provide a similar advantage for the first low voltage conductor 102 as that provided by the second low field contour 218 of FIG. 2. The fourth low field contour 313 and the sixth low field contour 329 may provide a similar advantage for the second low voltage conductor 103.

Figure 4A:
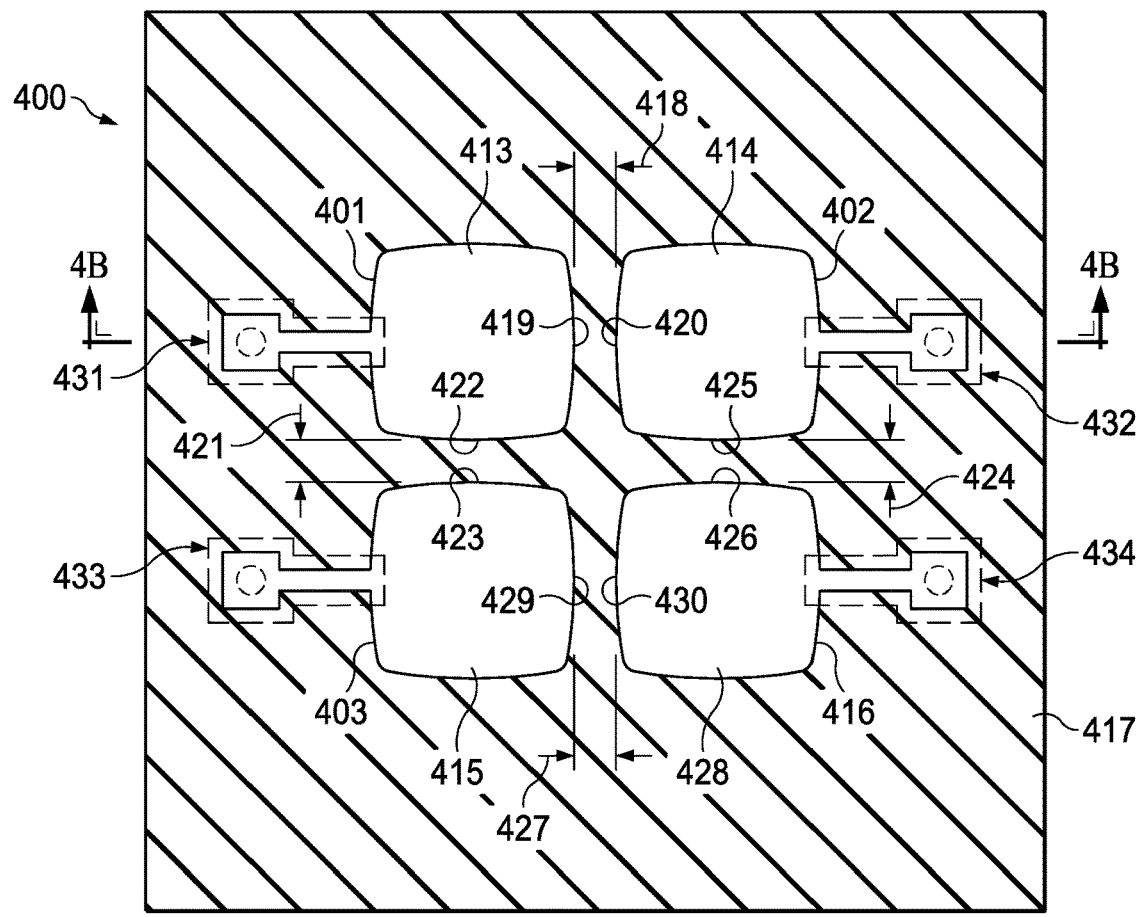
FIG. 4A is a top view and FIG. 4B is a cross section of another example microelectronic device having a high voltage conductor with a low field contour.
Figure 4B:
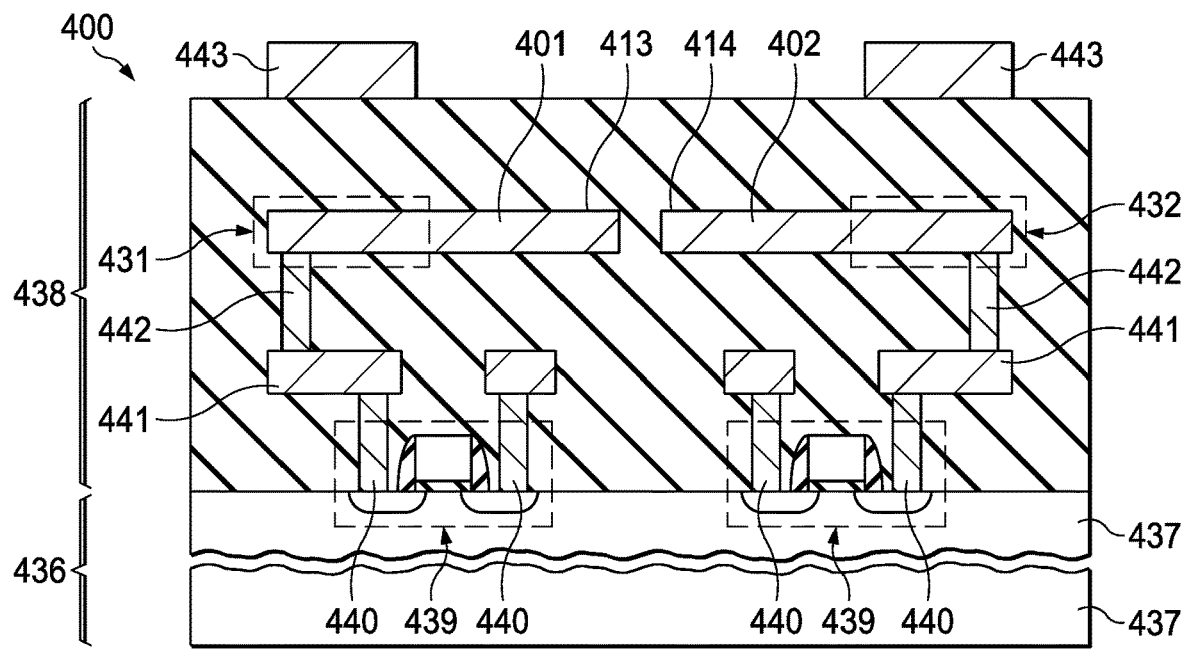

FIG. 4A is a top view and FIG. 4B is a cross section of another example microelectronic device having a high voltage conductor with a low field contour. Referring to FIG. 4A, the microelectronic device 400 of this example is manifested as a die, for example, as an integrated circuit, a discrete semiconductor device, an electro-optical device, a MEMS device, or a microfluidics device. FIG. 4A depicts the microelectronic device 400 partway through a fabrication sequence, before fabrication of the microelectronic device 400 is completed. The microelectronic device 400 includes a first high voltage conductor 401, a first low voltage conductor 402, a second high voltage conductor 416, and a second low voltage conductor 403. The first high voltage conductor 401, the first low voltage conductor 402, the second high voltage conductor 416, and the second low voltage conductor 403 may include, for example, aluminum or copper. The first high voltage conductor 401, the first low voltage conductor 402, the second high voltage conductor 416, and the second low voltage conductor 403 may be plates of a capacitor, for example. As shown in FIG. 4A, each of the first high voltage conductor 401, the first low voltage conductor 402, the second high voltage conductor 416, and the second low voltage conductor 403 includes four contoured edges. Each of the contoured edges of each of first high voltage conductor 401, the first low voltage conductor 402, the second high voltage conductor 416, and the second low voltage conductor 403 are connected to each other by sides, for example 419, 420, 422, 423, 425, 426, 429, and 430 of the respective conductors. The sides 419, 420, 422, 423, 425, 426, 429, and 430 are nonlinear from a top view of the microelectronic device 400 as shown.

The first high voltage conductor 401, the first low voltage conductor 402, the second high voltage conductor 416, and the second low voltage conductor 403 are surrounded by a dielectric layer 417. The dielectric layer 417 may include one or more layers of silicon dioxide, silicon nitride, silicon oxynitride, phosphosilicate glass (PSG), borophosphosilicate glass (BPSG), organosilicate glass (OSG), low-k dielectric material, aluminum oxide, boron nitride, or polyimide. Other dielectric materials for the dielectric layer 417 are within the scope of this example.

The first high voltage conductor 401 and the first low voltage conductor 402 are laterally separated by a first lateral separation 418. The first high voltage conductor 401 has a first low field contour 419 along a side facing the first low voltage conductor 402. The first low field contour 419 has offsets from a straight tangent line that is tangent to the first high voltage conductor 401, as disclosed in reference to FIG. 2 or FIG. 3. The first low voltage conductor 402 has a second low field contour 420 along a side facing the first high voltage conductor 401. The second low field contour 420 has offsets from a straight tangent line that is tangent to the first low voltage conductor 402, as disclosed in reference to FIG. 2 or FIG. 3.

The first high voltage conductor 401 and the second low voltage conductor 403 are laterally separated by a second lateral separation 421. The first high voltage conductor 401 has a third low field contour 422 along a side facing the second low voltage conductor 403. The third low field contour 422 has offsets from a straight tangent line that is tangent to the first high voltage conductor 401, as disclosed in reference to FIG. 2 or FIG. 3. The second low voltage conductor 403 has a fourth low field contour 423 along a side facing the first high voltage conductor 401. The fourth low field contour 423 has offsets from a straight tangent line that is tangent to the second low voltage conductor 403, as disclosed in reference to FIG. 2 or FIG. 3.

The first low voltage conductor 402 and the second high voltage conductor 416 are laterally separated by a third lateral separation 424. The first low voltage conductor 402 has a fifth low field contour 425 along a side facing the second high voltage conductor 416. The fifth low field contour 425 has offsets from a straight tangent line that is tangent to the first low voltage conductor 402, as disclosed in reference to FIG. 2 or FIG. 3. The second high voltage conductor 416 has a sixth low field contour 426 along a side facing the first low voltage conductor 402. The sixth low field contour 426 has offsets from a straight tangent line that is tangent to the second high voltage conductor 416, as disclosed in reference to FIG. 2 or FIG. 3.

The second low voltage conductor 403 and the second high voltage conductor 416 are laterally separated by a fourth lateral separation 427. The second low voltage conductor 403 has a seventh low field contour 429 along a side facing the second high voltage conductor 416. The seventh low field contour 429 has offsets from a straight tangent line that is tangent to the second low voltage conductor 403, as disclosed in reference to FIG. 2 or FIG. 3. The second high voltage conductor 416 has an eighth low field contour 430 along a side facing the second low voltage conductor 403. The eighth low field contour 430 has offsets from a straight tangent line that is tangent to the second high voltage conductor 416, as disclosed in reference to FIG. 2 or FIG. 3.

The first high voltage conductor 401 may have a first extension 431 for an electrical connection to other components of the microelectronic device 400. Similarly, first low voltage conductor 402 may have a second extension 432, the second low voltage conductor 403 may have a third extension 433, and the second high voltage conductor 416 may have a fourth extension 434.

The first high voltage conductor 401 has a first surface 413. The first low voltage conductor 402 has a second surface 414 that is parallel to, and coplanar with, the first surface 413. The second low voltage conductor 403 has a third surface 415 that is parallel to, and coplanar with, the first surface 413. The second high voltage conductor 416 has a fourth surface 428 that is parallel to, and coplanar with, the first surface 413.

Referring to FIG. 4B, the microelectronic device 400 of this example includes a substrate 436. The substrate 436 may include a semiconductor material 437 such as silicon, silicon carbide, or gallium nitride. The dielectric layer 417 is part of an interconnect region 438 on the substrate 436. The first high voltage conductor 401, the first low voltage conductor 402, the second low voltage conductor 403 of FIG. 4A, and the second high voltage conductor 416 of FIG. 4A are located in the interconnect region 438, in this example.

The microelectronic device 400 may include active components 439, depicted in FIG. 4B as metal oxide semiconductor (MOS) transistors. Other manifestations for the active components 439, such as bipolar junction transistors, or junction field effect transistors, are within the scope of this example. The active components 439 may be electrically coupled to the first high voltage conductor 401, the first low voltage conductor 402, the second low voltage conductor 403, and the second high voltage conductor 416, through contacts 440, interconnects 441 and vias 442 in the interconnect region 438. The microelectronic device 400 may include bond pads 443 which are electrically coupled to the active components 439; the electrical couplings are not shown in FIG. 4B to more clearly show the first high voltage conductor 401 and the first low voltage conductor 402.

During operation of the microelectronic device 400, the first high voltage conductor 401 and the second high voltage conductor 416 may be biased to potentials several hundred volts or more above the first low voltage conductor 402 and the second low voltage conductor 403. The low field contours 419, 420, 422, 423, 425, 426, 429, and 430 of FIG. 4A may limit electric fields in the dielectric layer 417, advantageously improving reliability of the microelectronic device 400.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
a first die attach pad and a second die attach pad, and a third die attach pad; and
a first die, a second die, and a third die attached to the first die attach pad, the second die attach pad, and the third die attach pad respectively, wherein each of the first die attach pad, the second die attach pad, and the third die attach pad includes contoured edges, and wherein at least one side of each of the first die attach pad, the second die attach pad, and the third die attach pad between two of the contoured edges is nonlinear in shape.

2. The microelectronic device of claim 1, wherein the first die attach pad and the second die attach pad are separated from each other by a first lateral separation.

3. The microelectronic device of claim 2, wherein the first lateral separation extends from a first straight tangent line that is tangent to the first die attach pad, to a second straight tangent line that is tangent to the second die attach pad.

4. The microelectronic device of claim 3, wherein:
the first die attach pad has a first field contour along a side facing the second die attach pad; and
the first straight tangent line is tangent to the first die attach pad on the first field contour.

5. The microelectronic device of claim 4, wherein:
the first field contour includes a first offset from the first straight tangent line, the first offset being located at a first lateral distance of 25 percent of the first lateral separation from a first end of the first die attach pad, the first offset being 19 percent to 28 percent of the first lateral separation;
the first field contour includes a second offset from the first straight tangent line, the second offset being located at a second lateral distance of 50 percent of the first lateral separation from the first end of the first die attach pad, the second offset being 9 percent to 14 percent of the first lateral separation; and
the first field contour includes a third offset from the first straight tangent line, the third offset being located at a third lateral distance of 75 percent of the first lateral separation from the first end of the first die attach pad, the third offset being 4 percent to 6 percent of the first lateral separation.

6. The microelectronic device of claim 3, wherein:
the second die attach pad has a second field contour along a side facing the first die attach pad; and
the second straight tangent line is tangent to the second die attach pad on the second field contour.

7. The microelectronic device of claim 6, wherein:
the second field contour has a first offset from the second straight tangent line, the first offset being located at a first lateral distance of 25 percent of the first lateral separation from a first end of the second die attach pad, the first offset being 19 percent to 28 percent of the first lateral separation;

the second field contour has a second offset from the second straight tangent line, the second offset being located at a second lateral distance of 50 percent of the first lateral separation from the first end of the second conductor, the second offset being 9 percent to 14 percent of the first lateral separation; and the second field contour has a third offset from the second straight tangent line, the third offset being located at a third lateral distance of 75 percent of the first lateral separation from the first end of the second conductor, the third offset being 4 percent to 6 percent of the first lateral separation.

8. The microelectronic device of claim 1, wherein the third die attach pad is separated from the first die attach pad by a second lateral separation, the second lateral separation extending from a third straight tangent line that is tangent to the first die attach pad, to a fourth straight tangent line that is tangent to the third die attach pad, wherein:

the first die attach pad has a third field contour along a side facing the third die attach pad; and the third straight tangent line is tangent to the first die attach pad on the third field contour.

9. The microelectronic device of claim 8, wherein the third field contour has a first offset from the third straight tangent line, the first offset being located at a first lateral distance of 25 percent of the second lateral separation from a third end of the first die attach pad, the first offset being 19 percent to 28 percent of the second lateral separation;

the third field contour has a second offset from the third straight tangent line, the second offset being located at a second lateral distance of 50 percent of the second lateral separation from the third end of the first die attach pad, the second offset being 9 percent to 14 percent of the second lateral separation; and the third field contour has a third offset from the third straight tangent line, the third offset being located at a third lateral distance of 75 percent of the second lateral separation from the third end of the first die attach pad, the third offset being 4 percent to 6 percent of the second lateral separation.

10. The microelectronic device of claim 8, wherein:

the third die attach pad has a fourth field contour along a side facing the first die attach pad;

the fourth straight tangent line is tangent to the third die attach pad on the fourth field contour;

the fourth field contour has a first offset from the fourth straight tangent line, the first offset being located at a first lateral distance of 25 percent of the second lateral separation from a first end of the third conductor, the first offset being 19 percent to 28 percent of the second lateral separation;

the fourth field contour has a second offset from the fourth straight tangent line, the second offset being located at a second lateral distance of 50 percent of the second lateral separation from the first end of the third die attach pad, the second offset being 9 percent to 14 percent of the second lateral separation; and the fourth field contour has a third offset from the fourth straight tangent line, the third offset being located at a third lateral distance of 75 percent of the second lateral separation from the first end of the third die attach pad, the third offset being 4 percent to 6 percent of the second lateral separation.

11. The microelectronic device of claim 1, wherein the first die attach pad and the second die attach pad are plates of a capacitor of the microelectronic device.

12. A microelectronic device, comprising:

a first die attach pad and a second die attach pad, and a third die attach pad;

a first die, a second die, and a third die attached to the first die attach pad, the second die attach pad, and the third die attach pad respectively, wherein each of the first die attach pad, the second die attach pad, and the third die attach pad includes contoured edges that impacts an electric field around the first die attach pad to a level less than a baseline electric field and wherein at least one side of each of the first die attach pad, the second die attach pad, and the third die attach pad between two of the contoured edges is nonlinear in shape.

13. The microelectronic device of claim 12, wherein the first die attach pad and the second die attach pad are separated from each other by a first lateral separation.

14. The microelectronic device of claim 13, wherein the first lateral separation extends from a first straight tangent line that is tangent to the first die attach pad, to a second straight tangent line that is tangent to the second die attach pad.

15. The microelectronic device of claim 14, wherein:

the first die attach pad has a first field contour along a side facing the second die attach pad; and the first straight tangent line is tangent to the first die attach pad on the first field contour.

16. The microelectronic device of claim 15, wherein:

the first field contour includes a first offset from the first straight tangent line, the first offset being located at a first lateral distance of 25 percent of the first lateral separation from a first end of the first die attach pad, the first offset being 19 percent to 28 percent of the first lateral separation;

the first field contour includes a second offset from the first straight tangent line, the second offset being located at a second lateral distance of 50 percent of the first lateral separation from the first end of the first die attach pad, the second offset being 9 percent to 14 percent of the first lateral separation; and the first field contour includes a third offset from the first straight tangent line, the third offset being located at a third lateral distance of 75 percent of the first lateral separation from the first end of the first die attach pad, the third offset being 4 percent to 6 percent of the first lateral separation.

17. The microelectronic device of claim 12, wherein the third die is coupling device including a transformer or a capacitor.

18. The microelectronic device of claim 1, wherein the at least one side of each of the first die attach pad, the second die attach pad, and the third die attach pad between two of the contoured edges is nonlinear in shape from a top view of the microelectronic device.

19. The microelectronic device of claim 12, wherein the at least one side of each of the first die attach pad, the second die attach pad, and the third die attach pad between two of the contoured edges is nonlinear in shape from a top view of the microelectronic device.

* * * * *